United States Patent
Rachapalli

(10) Patent No.: US 8,037,385 B2
(45) Date of Patent: Oct. 11, 2011

(54) SCAN CHAIN CIRCUIT AND METHOD

(75) Inventor: Triveni Rachapalli, Bangalore (IN)

(73) Assignee: QUALCOMM Incorporat, San Diego, CA (US)

( * ) Notice: Subject to any disclaimer, the term of this patent is extended or adjusted under 35 U.S.C. 154(b) by 244 days.

(21) Appl. No.: 12/334,407

(22) Filed: Dec. 12, 2008

(65) Prior Publication Data

US 2010/0153796 A1   Jun. 17, 2010

(51) Int. Cl.
*G01R 31/28* (2006.01)
*G01R 31/3187* (2006.01)
*G01R 31/26* (2006.01)

(52) U.S. Cl. ........ 714/731; 714/729; 714/726; 714/742; 714/724; 324/750.3; 324/762.01

(58) Field of Classification Search .................. 714/724, 714/726, 729, 731, 742; 324/750.3, 762.01
See application file for complete search history.

(56) References Cited

U.S. PATENT DOCUMENTS

| | | | |
|---|---|---|---|
| 5,130,568 A | | 7/1992 | Miller et al. |
| 5,488,614 A | * | 1/1996 | Shima ........................... 714/727 |
| 5,504,756 A | | 4/1996 | Kim |
| 6,446,229 B1 | | 9/2002 | Merrick et al. |
| 6,529,033 B1 | * | 3/2003 | Park et al. ....................... 326/16 |
| 6,877,119 B2 | * | 4/2005 | Lauga ........................... 714/726 |
| 7,539,915 B1 | * | 5/2009 | Solt ................................ 714/726 |
| 7,613,967 B1 | * | 11/2009 | Tan ................................. 714/726 |
| 7,657,809 B1 | * | 2/2010 | Bhatia ........................... 714/729 |
| 7,702,983 B2 | * | 4/2010 | Casarsa ......................... 714/729 |
| 2004/0019830 A1 | | 1/2004 | Hosotani |
| 2007/0143652 A1 | | 6/2007 | Baba |
| 2007/0300108 A1 | | 12/2007 | Saint-Laurent et al. |

FOREIGN PATENT DOCUMENTS

JP   2003-202362   * 7/2003

OTHER PUBLICATIONS

International Search Report—PCT/US2009/067661, International Search Authority—European Patent Office Mar. 17, 2010.
Written Opinion—PCT/ US2009/067661, International Search Authority—European Patent Office Mar. 17, 2010.

* cited by examiner

*Primary Examiner* — John J Tabone, Jr.
(74) *Attorney, Agent, or Firm* — Sam Talpalatsky; Michelle Gallardo; Jonathan T. Velasco

(57) ABSTRACT

A scan chain circuit is disclosed. The scan chain circuit includes a chain of serially coupled clocked circuits. In a first mode of operation, each of the clocked circuits toggles in response to a rising edge of a clock signal. In a second mode of operation, a first set of the clocked circuits in the chain of serially coupled clocked circuits toggle in response to the rising edge of the clock signal and a second set of the clocked circuits in the chain of serially coupled clocked circuits toggle in response to a falling edge of the clock signal.

24 Claims, 6 Drawing Sheets

SCAN CHAIN CIRCUIT AND METHOD

I. FIELD

The present disclosure generally relates to systems and methods of scan testing.

II. DESCRIPTION OF RELATED ART

As the technology for manufacturing integrated circuits advances, more logic functions are included in a single integrated circuit device, thereby increasing the number of gates on a single semiconductor device. The gates are interconnected to perform multiple and complex functions. A manufacturing defect may prevent the integrated circuit from performing all of the designed functions. To detect such errors, verification of the design of the integrated circuit device is conducted and various types of electrical testing are performed on the integrated circuit device.

As the complexity of the integrated circuit device increases, so does the cost and complexity of verifying and electrically testing each of the elements in the integrated circuit. Modern integrated circuits usually incorporate a variety of design-for-test (DFT) structures to enhance their testability. Typically, the DFT structures are based on a scan design, where scan test data is provided to a test pin or where a plurality of externally accessible scan chains are embedded into the integrated circuit. When the scan chain is embedded, the scan chain may include one or more scan cells coupled in series, with each scan cell including a flip-flop or a latch. Typically, scan test design is used in conjunction with fault simulation and combinational automatic test pattern generation (ATPG) to generate manufacturing and diagnostic test patterns for production test and prototype debug processes.

Accordingly, it would be advantageous to provide a scan chain circuit that reduces the cost and complexity of verifying and electrically testing each integrated circuit device.

III. SUMMARY

A scan chain circuit including a chain of serially coupled clocked circuits is disclosed. In a particular embodiment, an apparatus is disclosed that includes a chain of serially coupled clocked circuits. In a first mode of operation (e.g. a normal mode of operation), each clocked circuit toggles in response to a rising edge of a clock signal. In a second mode of operation (e.g. a test mode of operation), a first set of the clocked circuits in the chain of serially coupled clocked circuits toggle in response to the rising edge of the clock signal and a second set of the clocked circuits in the chain of serially coupled clocked circuits toggle in response to a falling edge of the clock signal.

In another particular embodiment, an apparatus is disclosed that includes a first set of serially coupled flip-flops and a second set of serially coupled flip-flops. Input logic is coupled to the first set of serially coupled flip-flops. The input logic is configured to receive a clock signal and is further configured to receive a control signal indicative of either a normal mode of operation or a test mode of operation. In the normal mode of operation, each of the serially coupled flip-flops toggle in response to the rising edge of the clock signal. In the test mode of operation, the first set of serially coupled flip-flops toggle in response to a falling edge of the clock signal while the second set of serially coupled flip-flops toggle in response to the rising edge of the clock signal.

In another particular embodiment, a method of testing a chain of clocked circuits is disclosed. The method includes providing test data to a first set of clocked circuits and substantially concurrently providing the test data to a second set of clocked circuits. The method further includes clocking the first set of clocked circuits to latch the test data upon a first edge of a clock signal and clocking the second set of clocked circuits to latch the test data upon a second edge of the clock signal.

In another particular embodiment, a method of testing a chain of clocked circuits is disclosed. The method includes, in a test mode of operation, providing test data to multiple input points of a chain of flip-flops and toggling the flip-flops to propagate the test data through the flip-flops. A first set of the chain of flip-flops toggles upon a first edge of a clock signal and a second set of the chain of flip-flops toggles upon a second edge of the clock signal. The method further includes reading the test data from the chain of flip-flops by reading a first data output of the first set of the chain of flip-flops upon the first edge of the clock signal and reading a second data output of the second set of the chain of flip-flops upon the second edge of the clock signal. The method further includes, in a normal mode of operation, providing the first data output of the first set of the chain of flip-flops to an input of the second set of the chain of flip-flops, where both the first set of the chain of flip-flops and the second set of the chain of flip-flops toggle upon the first edge of the clock signal.

In another particular embodiment, a method of testing a chain of clocked circuits is disclosed. The method includes providing a clock signal to a chain of N serially coupled latches, where N is an integer that is greater than 1. The method further includes testing the chain of N serially coupled latches in substantially N/2 clock cycles without increasing a frequency of the clock signal.

One particular advantage provided by at least one of the disclosed embodiments is that the cost and complexity of verifying and electrically testing each of the devices in an integrated circuit may be reduced by latching and strobing test data on both a rising edge and a falling edge of a clock signal.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
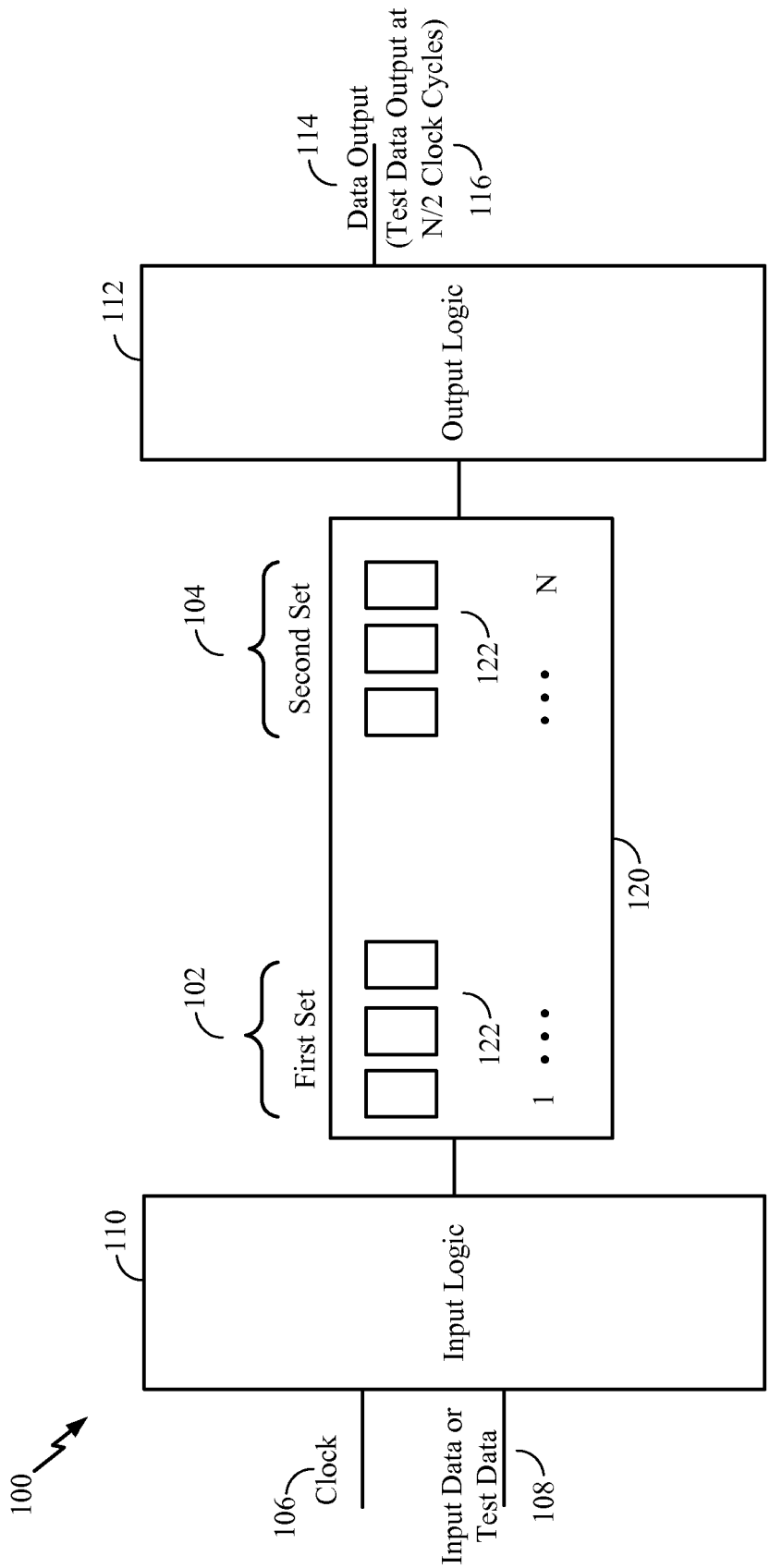
FIG. 1 is a block diagram of a system including a scan chain circuit.

Referring to FIG. 1, a block diagram of a system 100 including a scan chain circuit is shown. The system 100 includes input logic 110 and includes a chain of serially coupled clocked circuits 120 including a first set of serially coupled clocked circuits 102 and a second set of serially coupled clocked circuits 104. The system 100 also includes output logic 112. The input logic 110 has a first clock input 106 and a second data or test data input 108. The output logic 112 provides a data output 114.

During operation, a clock signal is received at the clock input 106 and input data or test data is received at the second input 108 to the input logic 110. During a test mode of operation, test data is received at the second input 108 by the input logic 110 and the test data is provided to the chain of serially coupled clocked circuits 120. The test data is provided to the first set of serially coupled clocked circuits 102 and to the second set of serially coupled clocked circuits 104. The test data passes through the chain of serially coupled clocked circuits 120 and is provided to the output logic 112 which in turn communicates the test data at the data output 114.

In a particular embodiment, the system 100 provides a clock signal received at the clock input 106 to a chain of N serially coupled latches 122 within the set of serially coupled clocked circuits 120. In a particular embodiment, N is an integer that is greater than 1. During the test mode of operation, the system 100 tests the chain of N serially coupled latches 122 in N/2 clock cycles by latching the test data in the first and second sets of clocked circuits 102 and 104 upon both the rising and falling edges of the clock signal, respectively. Therefore, test data is clocked through the system in N/2 clock cycles without increasing a frequency of the clock signal.

In a particular embodiment, the first and second sets of serially coupled clocked circuits 102 and 104 are sets of serially coupled latches, and the N/2 clock cycles is achieved by use of the first set 102 of serially coupled latches and the second set 104 of serially coupled latches in the chain. The first set of serially coupled latches 102 in the chain is configured to toggle upon a rising edge of the clock signal provided at the clock input 106. The second set of serially coupled latches 104 in the chain is configured to toggle upon a falling edge of the clock signal. In addition, in the particular embodiment illustrated in FIG. 1, the system 100 provides an output at the data output 114 of the first set of serially coupled latches 102 to a test output in a test mode of operation. In a normal mode of operation, the output from the first set of serially coupled latches 102 is provided to the second set of serially coupled latches 104. Thus, the system 100 can operate in both a normal operating mode, where input data is received at input 108 and clocked through the system and provided at the data output 114 in N clock cycles, and in a test operating mode where test data is received at the input 108 and clocked through the system and provided at the data output 114 in N/2 clock cycles 116. Therefore, test data is clocked through the system 100 in substantially half the time of normal data. Reducing the amount of time it takes to test an integrated circuit device may result in a substantial cost savings for the integrated circuit device manufacturer.

Figure 2:
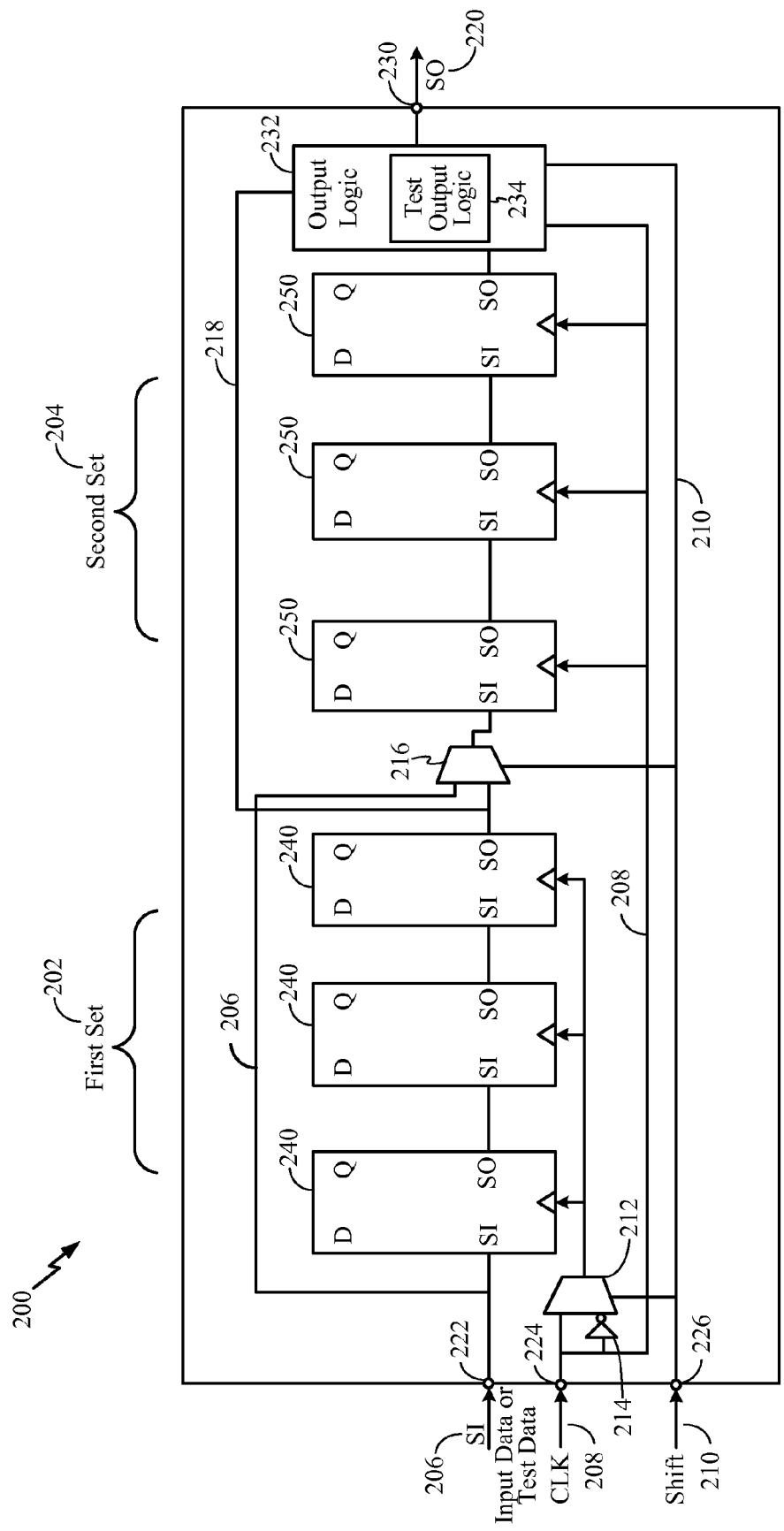
FIG. 2 is a block diagram of a first illustrative embodiment of a scan chain circuit.

Referring to FIG. 2, a block diagram of a first illustrative embodiment of an apparatus, such as the illustrated scan chain circuit, is shown. The scan chain circuit 200 includes a first set of serially coupled clocked circuits 202 and a second set of serially coupled clocked circuits 204. In a particular embodiment, each of the first set of serially coupled clocked circuits 202 is a latch or flip-flop 240 as shown. Similarly, each of the second set of serially clocked circuits 204 is a latch or a flip-flop 250. In a particular embodiment, each of the first set of serially coupled clock circuits 202 and each of the second set of serially coupled clocked circuits 204 is a D-type flip-flop. The scan chain circuit 200 further includes an input pin 222 responsive to a scan input which may include input data or test data as shown at 206. The scan chain circuit 200 further includes a clock pin 224 to receive a clock signal 208. In addition, the scan chain circuit 200 includes a control pin 226 to receive a control input, also referred to as "shift" input, as shown at 210. The scan chain circuit 200 includes an output pin 230 to provide output data 220. The output data 220 includes scan output (SO) data 220. The scan chain circuit 200 also includes input logic such as the illustrated multiplexer 212. The scan chain circuit 200 further includes output logic 232 which includes test output logic 234. In addition, the scan chain circuit 200 includes a second multiplexer 216 which is coupled between the first set of serially coupled clocked circuits 202 and the second set of serially coupled clocked circuits 204.

The scan input data 206 provided via the input pin 222 is fed into the first set of serially coupled clocked circuits 202. In addition, the clock signal 208 provided via the clock pin 224 is fed as an input to the input logic, such as to the multiplexer 212. The clock signal 208 provided via the multiplexer 212 is selectively provided to multiple latches 240 within the first set of serially coupled clocked circuits 202, as illustrated. In addition, the clock signal 208 is provided in parallel to a plurality of circuit devices, such as the latches 250 of the second set of serially coupled clocked circuits 204. The control input 210 provided via control pin 226 is input to the first multiplexer 212 and to the second multiplexer 216 and is also an input to the output logic 232. The output logic 232, which includes the test output logic 234, is coupled to an output of the second set of serially coupled clocked circuits 204 and is responsive to an output 218 of the first set of serially coupled clocked circuits 202.

During operation of the circuit 200, input data 206 is provided to the first set of serially coupled clocked circuits 202. In a first mode of operation, such as a normal mode of operation, the input data 206 is input data such as scan input data. The scan input data is provided to the first set of serially coupled clocked circuits 202 and is in series also provided via the second multiplexer 216 to the second set of serially coupled clocked circuits 204. Once the input data 206 is provided to both the first and second sets 202 and 204, respectively, of serially coupled clocked circuits, the data is then latched sequentially through the chain when the first and second sets of clocked circuits 202 and 204, respectively, toggle on a transition of the clock signal 208 from a low to high transition and is provided via output logic 232 as the resulting scan output data 220. The clock signal 208 is provided via the first multiplexer 212 to the first set of serially coupled latches 202 and to the second set of serially coupled latches 204 as illustrated. Thus, with each clock cycle, the input data 206 is sequentially moved through the chain of clocked circuits and is eventually provided at the scan data output 220.

In the second mode of operation, (e.g. a test mode of operation), the test data is provided at input pin 222. In addition, in the test mode of operation, the control input 210 indicates the test mode. In the test mode of operation, the control input 210 controls the first multiplexer 212 and the second multiplexer 216 in a manner to provide the clock signal 208 without modification to each latch 250 in the second set of serially coupled clocked circuits 204 but provides an inverted version of the clock signal through use of an inverter 214 and the first multiplexer 212 to each latch 240 in the first set of serially coupled clocked circuits 202. Thus, in a first mode of operation, each clocked circuit toggles and responds to a low to high transition of the clock signal or rising edge of the clock signal, such as for use in data input to output propagation. In the second mode of operation, such as the test mode, the second set of clocked circuits 204 in the chain of serially coupled clocked circuits toggle in response to the rising edge of the clock signal 208 and the first set of clocked circuits 202 in the chain of serially coupled clocked circuits effectively toggle in response to a high to low transition of the clock signal or the falling edge of the clock signal 208 since the first set of clocked circuits 202 receive an inverted clock signal.

In an alternative embodiment, the first and second sets of clocked circuits 202 and 204, respectively, could be juxtaposed so that the first set of clocked circuits operate on the rising edge of the clock signal and the second set of clocked circuits operate on the falling edge of the clock signal. In addition, the input logic, such as the input multiplexer 212, is coupled to the clock signal 208 and is configured to receive the control signal 210 so that the first multiplexer 212 selectively provides either the clock signal 208 or an inverted version of the clock signal to each clock input of the latches 240 of the first set of serially coupled clocked circuits 202.

By use of the rising and falling edges of the clock signal 208, the output data 220 in the test mode is provided in N/2 clock cycles when the scan chain circuit 200 includes N serially coupled latches 240 and 250. Therefore, test data is clocked through the system in substantially half the time of normal data. Dividing the scan chain into serially coupled clocked circuits that operate upon the falling and rising edges of the clock signal provides for faster testing at a speed that is substantially twice that of conventional test circuits. Thus, test cycles are performed at a rate that is substantially doubled, which reduces test time by approximately fifty percent, yielding improved testing and associated cost reduction benefits.

In the second mode of operation, test data is latched into the first set of clocked circuits 202 in response to each falling edge of the clock signal 208 and is latched in the second set of clocked circuits 204 in response to each rising edge of the clock signal 208. In addition, in the test mode of operation, an output of the first set of clocked circuits 202 is provided to a test output of the chain of serially coupled clocked circuits. In a particular embodiment, the scan data output 220 is the test output of the chain of serially coupled clocked circuits. The second multiplexer 216, driven by the control signal 210, is operable to provide direction of output data from the first set of serially coupled clocked circuits 202 either to the test output 220 or to the second set of serially coupled clocked circuits 204 respectively, depending upon the mode of operation selected.

In addition, the test output logic 234 within the output logic 232 is selectively operable to output a signal from the first set of clocked circuits 202 or to selectively output a signal from the second set of clocked circuits 204. In a particular embodiment, in the test mode of operation, the test output logic 234 includes multiplexing logic that can select between the first set of serially coupled clocked circuits 202 and the second set of serially coupled clocked circuits 204 with respect to output signals to be driven at the output pin 230. The clocked circuits within the first and second sets of clocked circuits 202 and 204 may be latches, flip-flops, or other similar devices. While specific multiplexers in a specific arrangement of components of the circuit 200 have been shown, it should be understood that alternative circuits may be used that provide the first and second mode selection operations and that drive clock signals in a manner similar to the system as shown.

Figure 3:
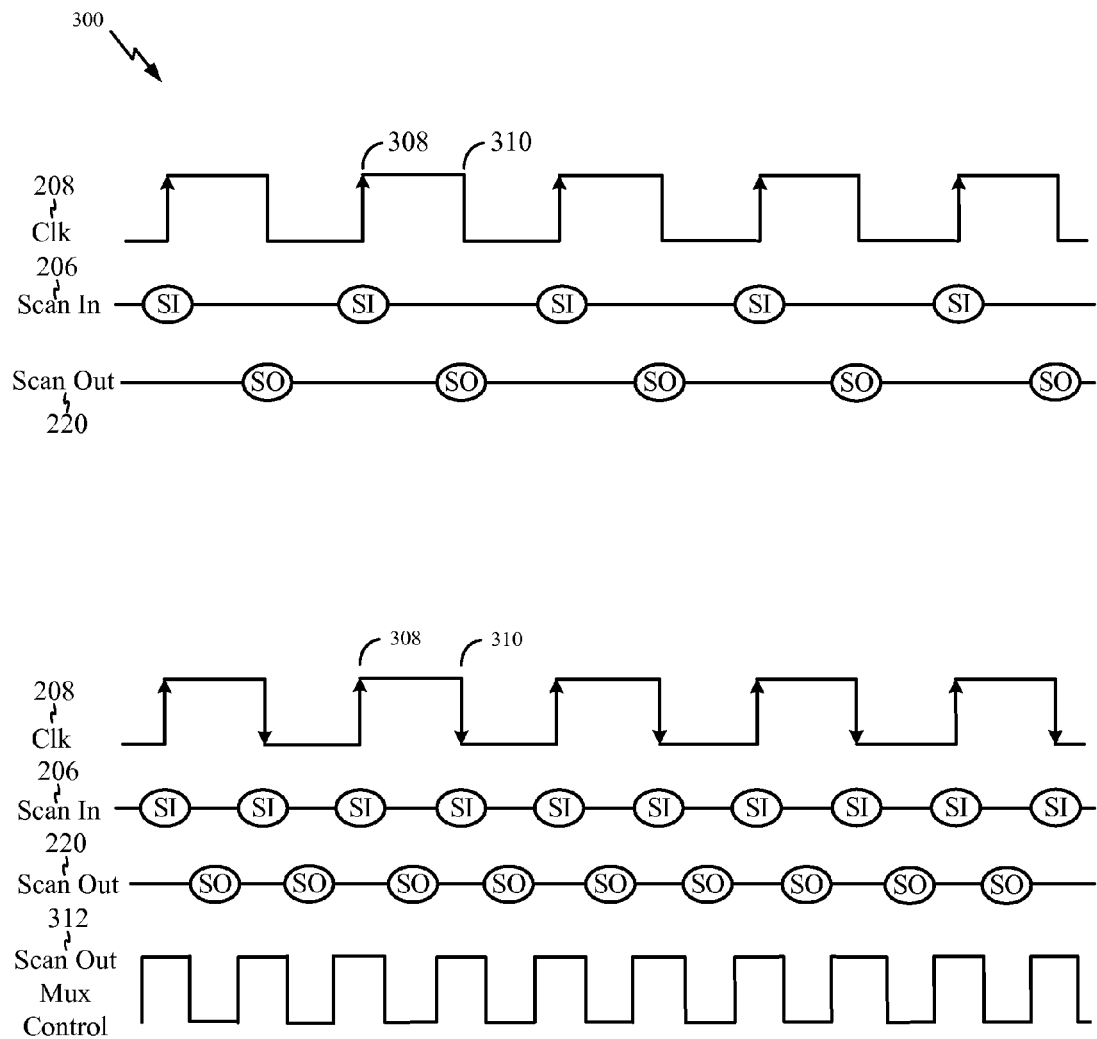
FIG. 3 is a timing diagram to illustrate operation of the scan chain circuit depicted in FIG. 2.

Referring to FIG. 3, a timing diagram 300 to illustrate operation of the circuit 200, as shown in FIG. 2, is depicted. The timing diagram 300 illustrates timing of the clock signal 208, the scan-in signal 206 and the scan-out signal 220 of the circuit 200. The clock signal 208 includes a plurality of cycles and at least one of these cycles has a rising edge as shown at 308 and a falling edge as shown at 310. The scan-in signal 206 performs a scan-in operation at one or more latch circuits upon activation or detection of the rising edge of the clock signal as shown. For example, upon the clock signal edge 308, a scan-in operation is performed, such as latching data at one of the latches within either the first or second sets of clocked circuits. The scan-out signal 220 includes a plurality of scan-out operations and each of the scan-out operations is performed upon or in response to detection of the falling edge of the clock signal 208. As an example, in connection with the falling edge 310 of the clock signal 208, a second illustrated scan-out operation is illustrated as being performed. Thus, in a normal mode of operation, data is scanned-in upon rising edges of the clock signal 208 and data is output on the falling edges of the clock signal 208.

In a test mode of operation, an additional scan-out multiplexer control signal 312 is illustrated. In the test mode of operation, test data is scanned-in at both the rising edge 308 and the falling edge 310 of the clock signal 208. Scan-out signal 220 occurs between the rising edge 308 and the falling edge 310 of the clock signal 208. Test data is latched on both the rising and falling edges and is also output on each of the rising and falling edges. Thus, test data is clocked through the system in substantially half the time of normal data.

Figure 4:
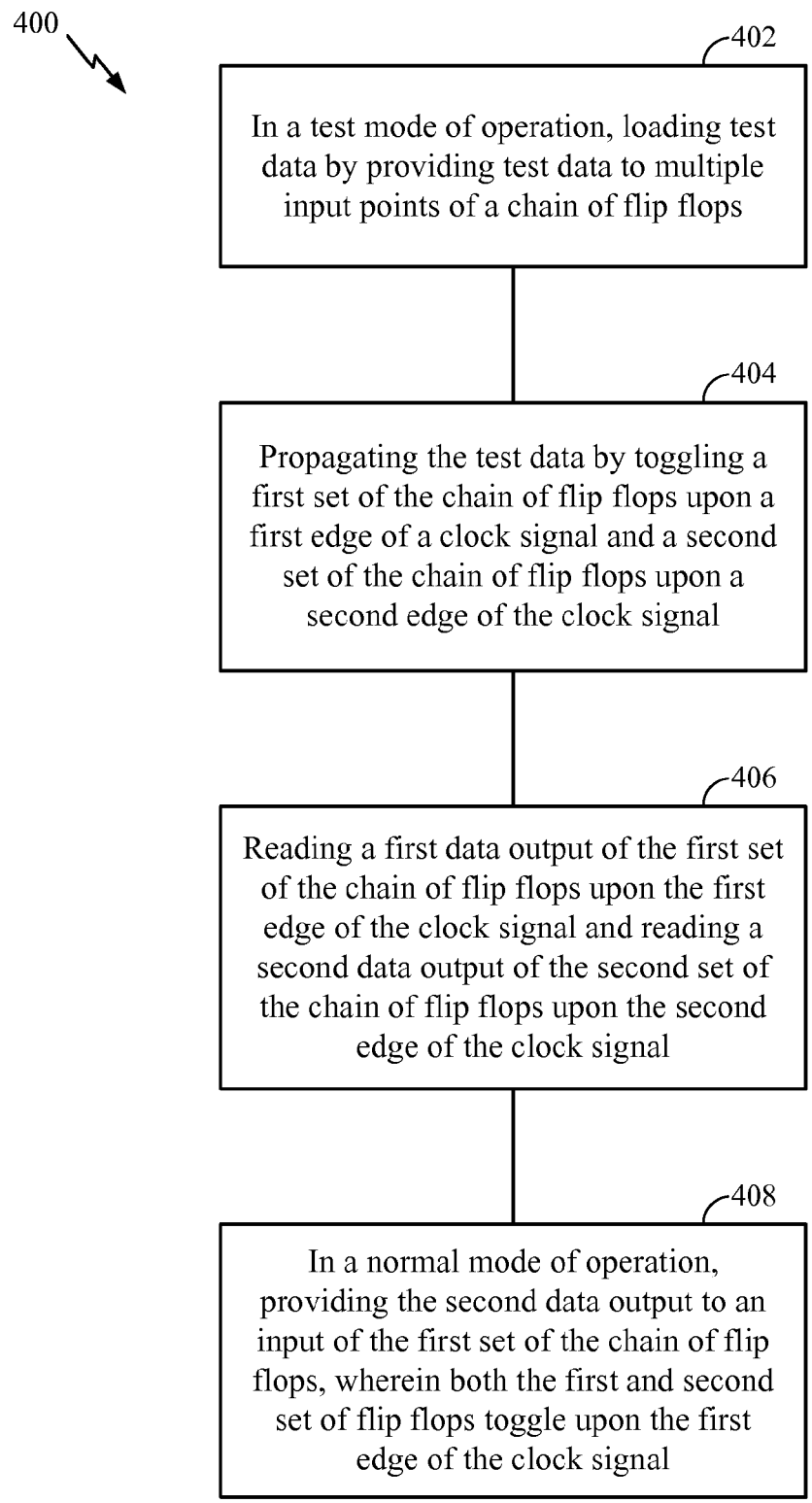
FIG. 4 is a flow chart of a first illustrative embodiment of a method of testing a chain of clocked circuits.

Referring to FIG. 4, a particular embodiment of a method of testing a chain of clocked circuits is illustrated. The method 400 includes, in a test mode of operation, loading test data by providing the test data to multiple input points in a chain of flip-flops, at 402. The method further includes propagating the test data by toggling a first set of the chain of flip-flops upon a first edge of a clock signal and a second set of the chain of flip-flops upon a second edge of the clock signal, as shown at 404. The method further includes reading a first data output of the first set of the chain of flip-flops upon the first edge of the clock signal and reading a second data output of the second set of the chain of flip-flops upon the second edge of the clock signals, as shown at 406. Thus, the method facilitates reading data from the first set of the chain of clocked circuits and the from the second set of the chain of clocked circuits upon detection of rising and falling edges of the clock signal for faster testing operation. In a particular embodiment, the first edge of the clock signal is a rising edge and the second edge is a falling edge. In an alternative embodiment, the first edge may be the falling edge and the second edge may be the rising edge depending on the particular implementation.

The method further includes, in a normal mode of operation, providing the second data output to an input of the first set of the chain of flip-flops, as shown at 408. For example, the first set of the chain of flip-flops may be the flip-flops 250 of FIG. 2, and the second set of the chain of flip-flops may be the flip-flops 240 of FIG. 2. The first and second sets of flip-flops toggle upon the first edge of the clock signal.

Figure 5:
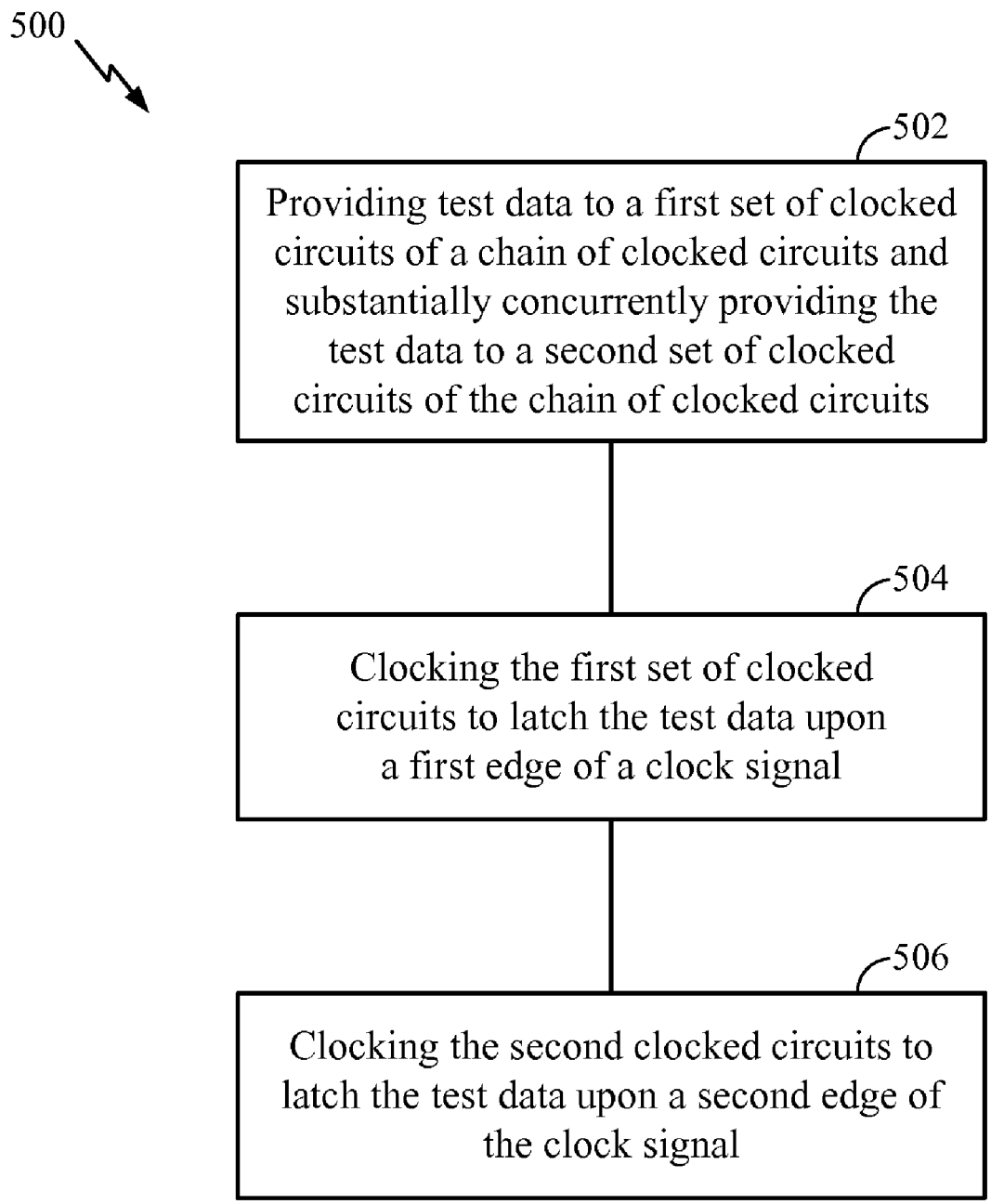
FIG. 5 is a flow chart of a second illustrative embodiment of a method of testing a chain of clocked circuits.

A further particular embodiment of a method of testing a chain of clocked circuits is illustrated in FIG. 5. The method includes providing test data to a first set of clocked circuits of a chain of clocked circuits and substantially concurrently providing the test data to a second set of clocked circuits of the chain of clocked circuits, as shown at 502. The method further includes clocking the first set of clocked circuits to latch the test data upon a first edge of a clock signal, as shown at 504. In a particular embodiment, the first edge of the clock signal is a rising edge. In an alternate embodiment, the first edge of the clock circuit may be a falling edge depending on the implementation. The method further includes clocking the second set of clocked circuits to latch the test data from a second edge of the clock signal, as shown at 506. In a particular embodiment, the second edge of the clock signal is a falling edge. In an alternate embodiment, the second edge may be a rising edge depending on the implementation. Thus, the method facilitates reading data from the first set of the chain of clocked circuits and the from the second set of the chain of clocked circuits upon detection of rising and falling edges of the clock signal for faster testing operation.

Figure 6:
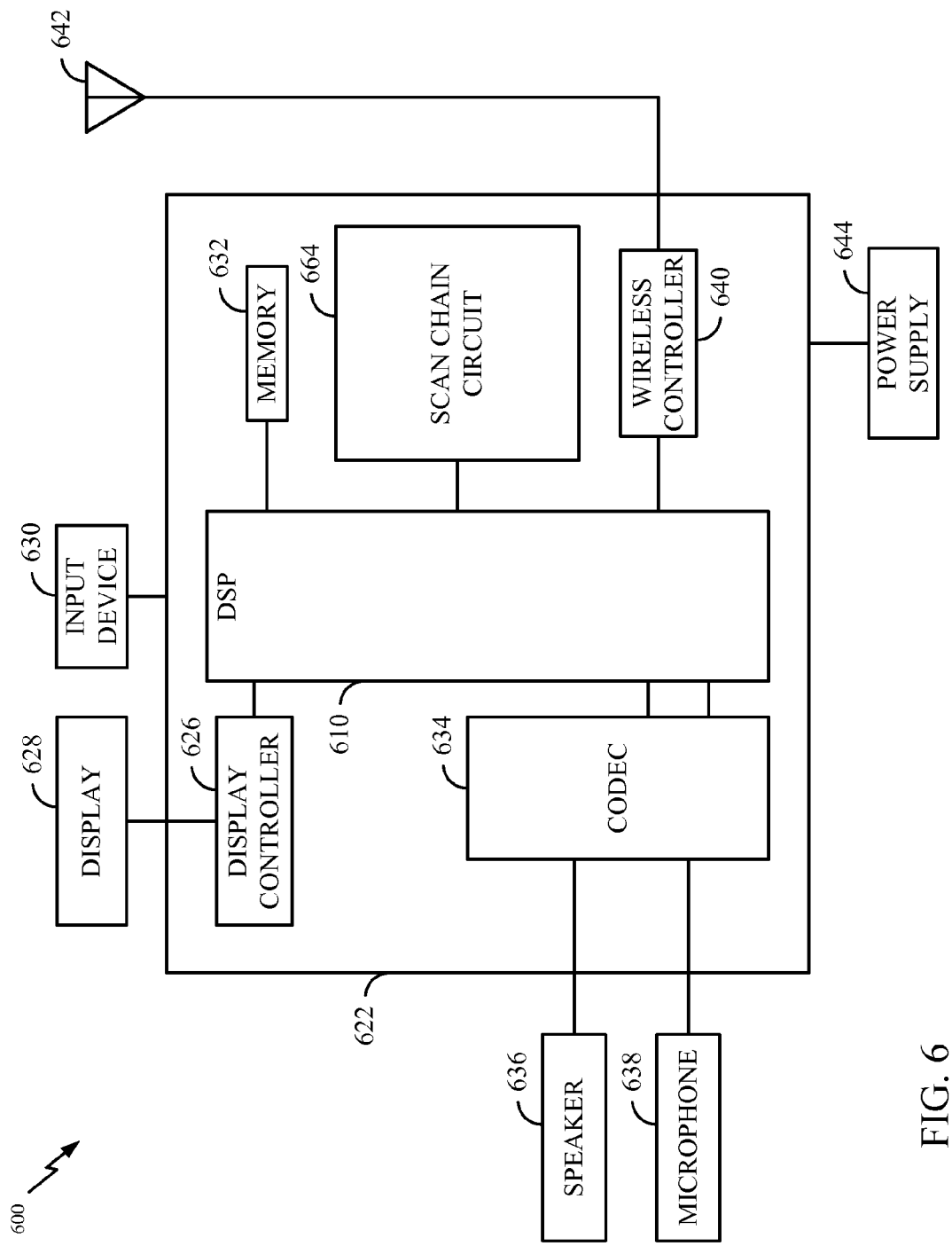
FIG. 6 is a block diagram of a particular illustrative embodiment of a wireless device including a scan chain circuit.

Referring to FIG. 6, a block diagram of a particular illustrative embodiment of an electronic device, such as a wireless phone, including a scan chain circuit as described herein, is depicted and is generally designated 600. The device 600 includes a processor, such as a digital signal processor (DSP) 610, coupled to a memory 632 and also coupled to a scan chain circuit 664. In an illustrative example, the scan chain circuit 664 includes the system depicted in FIG. 1 or the circuit depicted in FIG. 2, and is testable using the method of FIG. 4 or FIG. 5. By providing improved scan chain test circuitry, the cost and complexity of verifying and electrically testing each of the devices in an integrated circuit and in large scale components of the wireless device 600 may be reduced.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless controller 640 can be coupled to the digital signal processor 610 and to a wireless antenna 642. In a particular embodiment, the DSP 610, the display controller 626, the memory 632, the CODEC 634, the wireless controller 640, and the scan chain circuitry 664 are included in a system-in-package or system-on-chip 622. In a particular embodiment, an input device 630 and a power supply 644 are coupled to the on-chip system 622. Moreover, in a particular embodiment, as illustrated in FIG. 6, the display 628, the input device 630, the speaker 636, the microphone 638, the wireless antenna 642, and the power supply 644 are external to the on-chip system 622. However, each can be coupled to a component of the on-chip system 622, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), magnetoresistive random access memory (MRAM), phase-change random access memory (PRAM), or spin torque transfer MRAM (STT-MRAM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:
   a chain of serially coupled clocked circuits, wherein in a first mode of operation, each of the clocked circuits toggles in response to a rising edge of a clock signal and in a second mode of operation, a first set of the clocked circuits in the chain of serially coupled clocked circuits toggle in response to a rising edge of an inverted clock signal and a second set of the clocked circuits in the chain of serially coupled clocked circuits toggle in response to the rising edge of the clock signal;
   input logic configured to provide the clock signal or the inverted clock signal to the first set of the clocked circuits based on a control signal, wherein the control signal is indicative of the first mode of operation or the second mode of operation; and
   selection logic configured to provide an output signal of the first set of the clocked circuits or a data input signal to an input of the second set of the clocked circuits based on the control signal.

2. The apparatus of claim 1, wherein test data is latched into the first set of clocked circuits in response to each rising edge of the inverted clock signal, and wherein the test data is latched into the second set of clocked circuits in response to each rising edge of the clock signal.

3. The apparatus of claim 1, wherein in the second mode of operation, the output of the first set of clocked circuits is coupled to a test output of the chain of serially coupled clocked circuits, and wherein in the first mode of operation, the output of the first set of clocked circuits is coupled to the input of the second set of clocked circuits.

4. The apparatus of claim 1, further comprising test output logic to selectively output a signal from the first set of clocked circuits or to selectively output a signal from the second set of clocked circuits.

5. The apparatus of claim 4, wherein the test output logic comprises a multiplexer.

6. The apparatus of claim 1, wherein the input logic comprises:
   an inverter coupled to the clock signal and configured to generate the inverted clock signal; and
   second selection logic configured in the second mode of operation to couple the inverted clock signal to the first set of clocked circuits.

7. The apparatus of claim 1, wherein the first mode of operation is a normal mode of operation and the second mode of operation is a test mode of operation.

8. The apparatus of claim 1, wherein the chain of serially coupled clocked circuits comprises a plurality of latches.

9. The apparatus of claim 1, wherein the chain of serially coupled clock circuits comprises a plurality of flip-flops.

10. The apparatus of claim 1, wherein in the first mode of operation, the selection logic provides the output signal of the first set of the clocked circuits to the input of the second set of the clocked circuits.

11. The apparatus of claim 10, wherein the input logic is configured to receive the clock signal and to receive the control signal, and wherein the input logic is further configured to generate the inverted clock signal from the clock signal.

12. The apparatus of claim 10, wherein the input logic comprises a multiplexer.

13. The apparatus of claim 10, wherein the control signal comprises a shift signal.

14. The apparatus of claim 10, further comprising a first pin configured to receive the clock signal, a second pin configured to receive the control signal, and a third pin configured to provide a test output signal at substantially twice a speed of the output signal of the first set of the clocked circuits.

15. The apparatus of claim 10, further comprising a data input pin configured to receive scan input data and a scan output pin configured to provide scan output data.

16. An apparatus, comprising:
a first set of serially coupled flip-flops coupled to operate in response to a rising edge of a clock signal;
a second set of serially coupled flip-flops coupled to operate in response to the rising edge of the clock signal in a first mode of operation and in response to a rising edge of an inverted clock signal in a second mode of operation;
input logic coupled to the first set of serially coupled flip-flops, the input logic configured to receive the clock signal and to generate the inverted clock signal from the clock signal and further configured to receive a control signal indicative of the first mode of operation or the second mode of operation, wherein the clock signal or the inverted clock signal is provided to the second set of serially coupled flip-flops based on the control signal;
selection logic configured to couple an output of the first set of serially coupled flip-flops or a data input to an input of the second set of serially coupled flip-flops based on the control signal; and
output logic configured to select, based on the clock signal, the output of the first set of serially coupled flip-flops or an output of the second set of serially coupled flip-flops in response to the control signal indicating the second mode of operation;
wherein in the first mode of operation, each of the first set of serially coupled flip-flops and the second set of serially coupled flip-flops toggles in response to the rising edge of the clock signal, and in the second mode of operation, each of the first set of serially coupled flip-flops toggles in response to the rising edge of the clock signal and the second set of serially coupled flip-flops toggles in response to the rising edge of the inverted clock signal.

17. The apparatus of claim 16, wherein the input logic comprises an inverter coupled to receive the clock signal, and wherein the inverter is configured to generate the inverted clock signal.

18. A method of testing a chain of clocked circuits, the method comprising:
providing test data to a first set of clocked circuits of the chain of clocked circuits and substantially concurrently providing the test data to a second set of clocked circuits of the chain of clocked circuits;
providing a first clock signal or a second clock signal to the first set of clocked circuits based on a control signal, wherein the second clock signal is an inversion of the first clock signal;
clocking the first set of clocked circuits to latch the test data upon a first edge of the first clock signal in a first mode of operation;
clocking the first set of clocked circuits upon a first edge of the second clock signal in a second mode of operation;
clocking the second set of clocked circuits to latch the test data upon the first edge of the first clock signal in the first mode of operation; and
clocking the second set of clocked circuits to latch output data of the first set of clocked circuits upon the first edge of the first clock signal in the second mode of operation, wherein the control signal selects the first mode of operation or the second mode of operation.

19. The method of claim 18, wherein the first edge of the first clock signal is a rising edge and the first edge of the second clock signal is a rising edge.

20. The method of claim 18, further comprising selecting, in response to the control signal indicating the second mode of operation, the output data of the first set of clocked circuits of the chain of clocked circuits or output data of the second set of clocked circuits of the chain of clocked circuits, to generate test output data.

21. A method, comprising:
in response to a first value of a control signal indicative of a first mode of operation:
providing input test data to multiple input points of a chain of flip-flops and toggling the flip-flops to propagate the input test data through the flip-flops, wherein a first set of the chain of flip-flops toggles upon a first edge of a clock signal and a second set of the chain of flip-flops toggles upon the first edge of the clock signal, wherein an input of the second set of the chain of flip-flops is coupled to one of the multiple input points of the chain of flip-flops;
in response to a second value of the control signal indicative of a second mode of operation:
providing a first data output of the first set of the chain of flip-flops to the input of the second set of the chain of flip-flops, wherein the first set of the chain of flip-flops toggle upon the first edge of the clock signal and the second set of the chain of flip-flops toggle upon a first edge of an inverted clock signal;
generating a test output signal by selecting, based on the clock signal, a first data output of the first set of the chain of flip-flops or a second data output of the second set of the chain of flip-flops.

22. A method, comprising:
providing a clock signal to a second set of serially coupled latches in a chain of N serially coupled latches, where N is an integer that is greater than one;
providing the clock signal or an inverted clock signal to a first set of serially coupled latches in the chain based on a control signal, wherein the inverted clock signal is generated by inverting the clock signal and wherein the first set of the serially coupled latches toggle upon a first edge of the clock signal in a first mode of operation and the second set of the serially coupled latches toggle upon a first edge of the inverted clock signal in a second mode of operation;

providing a first output signal of the first set of serially coupled latches or a data input signal to an input of the second set of serially coupled latches based on the control signal; and testing the chain of N serially coupled latches in substantially N/2 clock cycles without increasing a frequency of the clock signal.

23. The method of claim 22, wherein:

the second set of serially coupled latches is configured to toggle upon a rising edge of the clock signal; and the first set of serially coupled latches is configured to toggle upon a rising edge of the inverted clock signal.

24. The method of claim 23, further comprising:

generating a scan output signal, wherein the scan output signal comprises the first output signal of the first set of serially coupled latches selected at rising edges of the clock signal and a first output signal of the second set of serially coupled latches selected at falling edges of the clock signal.

\* \* \* \* \*